United States Patent
Feng et al.

(10) Patent No.: US 12,064,952 B2
(45) Date of Patent: Aug. 20, 2024

(54) LASER TRANSFER PRINTING DEVICE AND METHOD

(71) Applicants: INSTITUTE OF FLEXIBLE ELECTRONICS TECHNOLOGY OF THU, ZHEJIANG, Zhejiang (CN); Tsinghua University, Beijing (CN)

(72) Inventors: Xue Feng, Zhejiang (CN); Baicheng Zhang, Zhejiang (CN); Ying Chen, Zhejiang (CN); Haoran Fu, Zhejiang (CN); Ye Jiang, Zhejiang (CN); Lanlan Liu, Zhejiang (CN)

(73) Assignees: INSTITUTE OF FLEXIBLE ELECTRONICS TECHNOLOGY OF THU, ZHEJIANG, Zhejiang (CN); TSINGHUA UNIVERSITY, Beijing (CN)

( * ) Notice: Subject to any disclaimer, the term of this patent is extended or adjusted under 35 U.S.C. 154(b) by 984 days.

(21) Appl. No.: 17/043,926

(22) PCT Filed: Dec. 7, 2018

(86) PCT No.: PCT/CN2018/119655
§ 371 (c)(1),
(2) Date: Sep. 30, 2020

(87) PCT Pub. No.: WO2019/227887
PCT Pub. Date: Dec. 5, 2019

(65) Prior Publication Data
US 2021/0122153 A1    Apr. 29, 2021

(30) Foreign Application Priority Data
May 31, 2018   (CN) .......................... 201810552110.7

(51) Int. Cl.
*B41M 5/24*       (2006.01)
*B41F 16/00*      (2006.01)
(Continued)

(52) U.S. Cl.
CPC ........... *B41F 16/0006* (2013.01); *B41M 5/24* (2013.01); *G02B 27/0075* (2013.01);
(Continued)

(58) Field of Classification Search
CPC .. B41F 16/0006; B41M 5/24; G02B 27/0075; G02B 27/09; G02B 27/10; G02B 21/04;
(Continued)

(56) References Cited

U.S. PATENT DOCUMENTS

| | | | |
|---|---|---|---|
| 2002/0021491 A1* | 2/2002 | Engelhardt | G02B 21/32 359/368 |
| 2005/0211163 A1* | 9/2005 | Li | B33Y 40/00 118/308 |
| 2009/0217517 A1* | 9/2009 | Pique | H05K 3/321 29/840 |

FOREIGN PATENT DOCUMENTS

| | | | | |
|---|---|---|---|---|
| CN | 104570363 | | 4/2015 | |
| CN | 106825915 A | * | 6/2017 | ......... B23K 26/0643 |

(Continued)

OTHER PUBLICATIONS

CN-106825915-A, machine translation, originally published 2017, p. 1-10 (Year: 2017).*

(Continued)

*Primary Examiner* — Yaovi M Ameh
(74) *Attorney, Agent, or Firm* — Hodgson Russ LLP

(57) ABSTRACT

A laser transfer printing device and a laser transfer printing method are provided. The laser transfer printing device includes a laser, a beam expander, a beam splitter and a focusing module. The laser is configured to generate a laser (Continued)

beam. The beam expander is disposed on an optical path of the laser beam generated by the laser to expand the laser beam generated by the laser. The beam splitter is disposed on an optical path of the laser beam expanded by the beam expander to reflect the expanded laser beam to the focusing module. The focusing module is disposed on an optical path of the laser beam reflected by the beam splitter to focus the laser beam and project the focused laser beam to a predetermined transfer processing position.

20 Claims, 4 Drawing Sheets

(51) Int. Cl.
*G02B 27/00* (2006.01)
*G02B 27/09* (2006.01)
*G02B 27/10* (2006.01)
G02B 21/04 (2006.01)
H05K 3/30 (2006.01)

(52) U.S. Cl.
CPC ............ *G02B 27/09* (2013.01); *G02B 27/10* (2013.01); *G02B 21/04* (2013.01); *G02B 27/0955* (2013.01); *G02B 27/0983* (2013.01); *G02B 27/0988* (2013.01); *H05K 3/30* (2013.01)

(58) Field of Classification Search
CPC ............ G02B 27/0955; G02B 27/0983; G02B 27/0988; H05K 3/30
See application file for complete search history.

(56) References Cited

FOREIGN PATENT DOCUMENTS

| | | |
|---|---|---|
| CN | 107685196 A | 2/2018 |
| JP | 2000356746 A | 12/2000 |

OTHER PUBLICATIONS

WIPO, ISR for PCT/CN2018/119655, Mar. 7, 2019.
CNIPA, First Office Action for CN Application No. 201810552110.7, Jan. 25, 2024.

\* cited by examiner

LASER TRANSFER PRINTING DEVICE AND METHOD

CROSS-REFERENCE TO RELATED APPLICATIONS

This application is a U.S. National Phase entry of International Patent Application No. PCT/CN2018/119655, filed Dec. 7, 2018, which claims priority to Chinese Patent Application Serial No. 201810552110.7, filed May 31, 2018, the entire disclosures of which are incorporated herein by reference.

FIELD

The present disclosure relates to a flexible electronic manufacturing field, in particularly to a laser transfer printing device and a laser transfer printing method.

BACKGROUND

Flexible electronics is an emerging electronic technology, which is used for manufacturing organic/inorganic material electronic devices on flexible/ductile plastic or thin metal substrates. With the unique flexibility/ductility and high-efficiency and low-cost manufacturing process, the flexible electronics has wide application prospects in the fields of information, energy, medical treatment, national defense, etc. In the field of manufacturing flexible electronic devices, especially in inorganic flexible electronic technologies, it is necessary to transfer a device from a rigid planar substrate to a flexible non-planar substrate. The transfer printing technology is the key technology to realize this transfer process. Currently, common transfer printing technologies include rate-based transfer printing, microstructure-based transfer printing, load-regulated transfer printing, laser-driven transfer printing, shape memory polymer-based transfer printing and the like, in which laser-driven transfer printing has broader industrial application prospects.

In the current traditional technology, the laser-driven transfer printing technology includes: irradiating a stamp surface of a shape memory polymer substrate with pulse laser generated by a femtosecond laser; a microstructure on the stamp surface restoring to the initial morphology after being heated to a phase transition temperature thereof to reduce the contact area and the adhesion between the shape memory polymer substrate and a component to be transferred; and the component to be transferred falling off the stamp surface to a flexible substrate to complete the transfer of the component. However, a thermal diffusion caused by the large area of a laser light source affects the transfer printing of other devices, such that a high-precision selective transfer printing cannot be achieved.

SUMMARY

Based on the problem that thermal diffusion affects the transfer printing of other components and thus high-precision selective transfer printing cannot be achieved, it is necessary to provide a laser transfer printing device and a laser transfer printing method.

A laser transfer printing device includes a laser, a beam expander, a beam splitter and a focusing module. The laser is configured to generate a laser beam. The beam expander is disposed on an optical path of the laser beam generated by the laser to expand the laser beam generated by the laser. The beam splitter is disposed on an optical path of the laser beam expanded by the beam expander to reflect the expanded laser beam to the focusing module. The focusing module is disposed on an optical path of the laser beam reflected by the beam splitter to focus the laser beam and project the focused laser beam to a predetermined transfer processing position.

In an embodiment, the laser transfer printing device further includes an imaging module and a display module. The imaging module is configured to receive the laser beam reflected at the predetermined transfer processing position to obtain an image of the predetermined transfer processing position. The display module is configured to receive and display the image of the predetermined transfer processing position.

In an embodiment, the laser transfer printing device further includes a light source pinhole. The light source pinhole is disposed on an optical path between the laser and the beam expander to eliminate a scattering of the laser beam itself.

In an embodiment, the laser transfer printing device further includes an imaging pinhole. The imaging pinhole is disposed between the beam splitter and the imaging module to filter an interference laser beam reflected at the predetermined transfer processing position.

In an embodiment, the laser is a continuous laser.

In an embodiment, the focusing module is a bright field focusing unit. The focusing module includes a focusing lens and an optical lens, in which the focusing lens has an incident end and an exit end. An expanded cylindrical laser beam enters the focusing lens at the incident end. The optical lens is configured to focus the laser beam and project the focused laser beam to the predetermined transfer processing position.

In an embodiment, the focusing module is a dark field focusing unit. The focusing module includes a focusing lens, an optical mirror and an optical lens, in which the focusing lens has an incident end and an exit end. The optical mirror is an annular optical mirror, and the optical lens is disposed in a hole of the annular optical mirror. An expanded tubular laser beam enters the focusing lens at the incident end to be reflected for a first time on the optical mirror. The first reflected laser beam is reflected for a second time on a side wall of the focusing lens. The second reflected laser beam is focused, and the focused laser beam is projected to the predetermined transfer processing position.

In an embodiment, the optical lens is an optical lens group.

A laser transfer printing method for the laser transfer printing device described above includes: generating a laser beam by the laser; expanding by the beam expander the laser beam generated by the laser; reflecting by the beam splitter the laser beam expanded by the beam expander to the focusing module; and focusing the laser beam by the focusing module and projecting the focused laser beam to a predetermined transfer processing position by the focusing module.

In an embodiment, when the focusing module is a bright field focusing unit, the transfer printing space has a boundary with a light intensity attenuated to 1/e of that of a center of the space, and a device disposed on a shape memory polymer substrate is transferred to a flexible substrate based on the transfer printing space.

By the abovementioned laser transfer printing device, the laser beam generated by the laser is expanded and reflected to the focusing module. The laser beam is focused by the focusing module, and the focused laser beam is projected by the focusing module to the predetermined transfer processing position to perform transfer printing. Since the laser beam is focused by the focusing module and the focused laser beam is used for transfer printing, the laser irradiation area and thus the range of thermal diffusion are reduced. Moreover, by using the transfer printing space for transfer printing, the impact on other peripheral devices is reduced to achieve high-precision selective transfer printing.

NUMERALS

100 laser; 200 beam expander; 300 beam splitter; 400 focusing module; 410 bright field focusing unit; 411, 421, focusing lens; 412, 422, optical lens; 420 dark field focusing unit; 423 optical mirror; 510 imaging module; 520 display module; 610 light source pinhole; 620 imaging pinhole; 700 shape memory polymer substrate; 800 device; 900 flexile substrate.

DETAILED DESCRIPTION

In order to make the purpose, technical scheme and advantages of the present disclosure more clear and obvious, the present disclosure will be further illustrated in detail in combination with accompanying drawings and embodiments hereinafter. It should be understood that the embodiments described here are used only to explain this present disclosure, rather than limit it.

Figure 1:
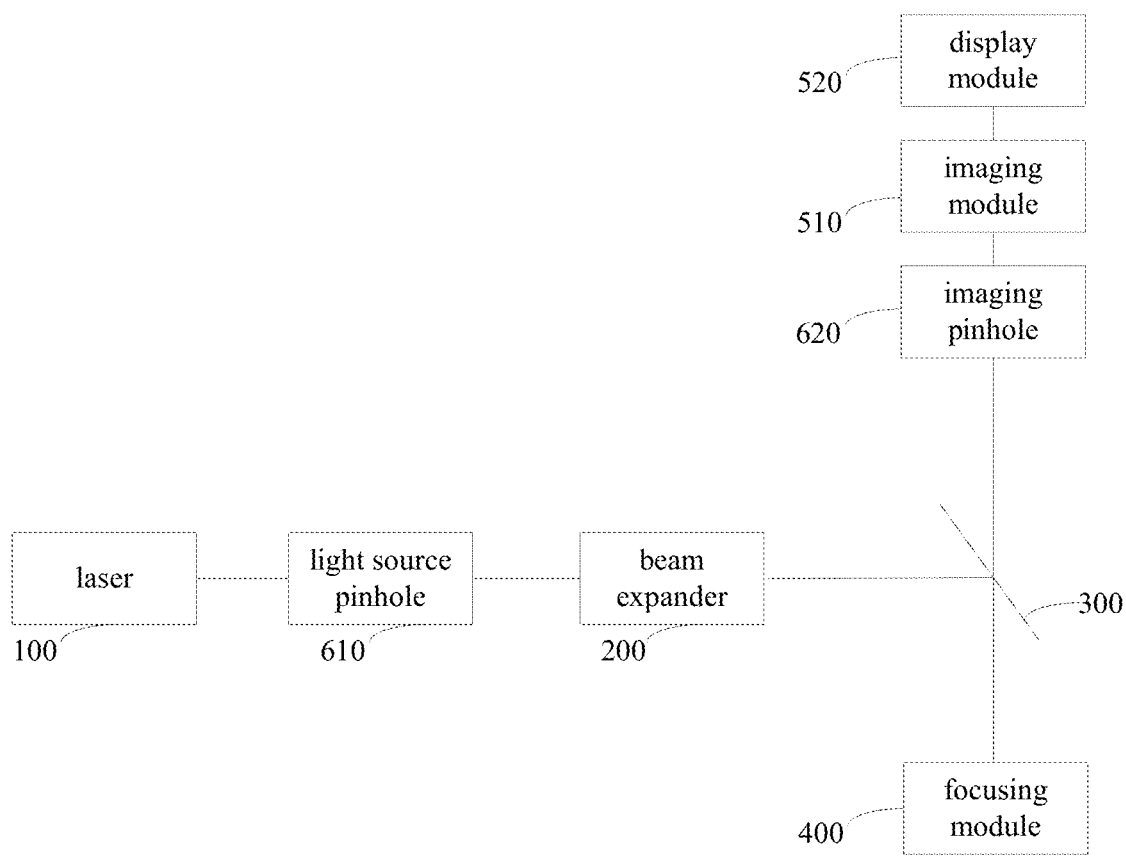
FIG. 1 is a schematic diagram of a laser transfer printing device according to an embodiment of the present disclosure.
Figure 2:
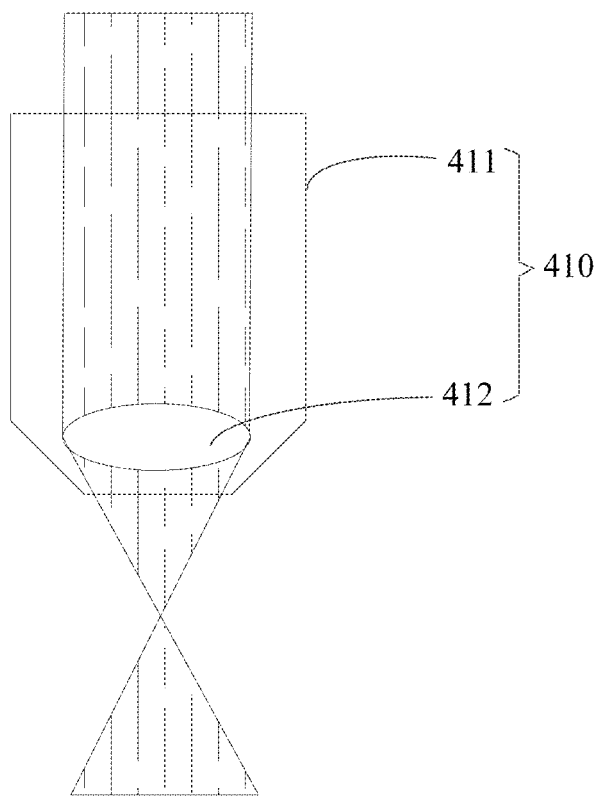
FIG. 2 is a schematic view of an optical path of a bright field focusing unit according to an embodiment of the present disclosure.
Figure 3:
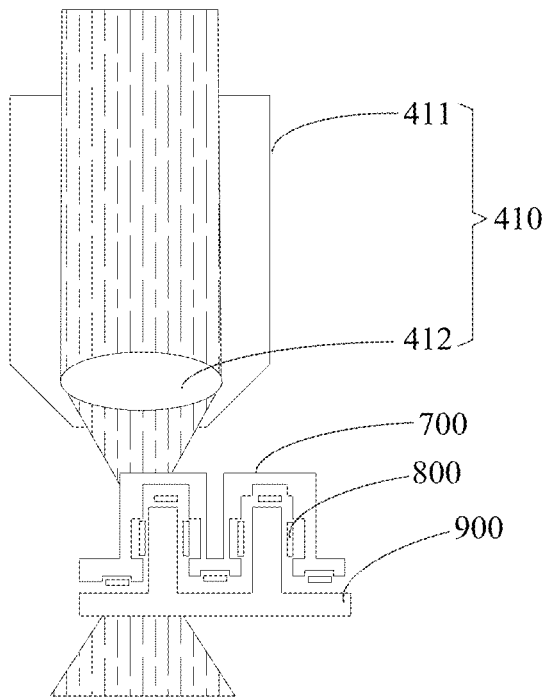
FIG. 3 is a schematic view of a usage state of a bright field focusing unit according to an embodiment of the present disclosure.
Figure 4:
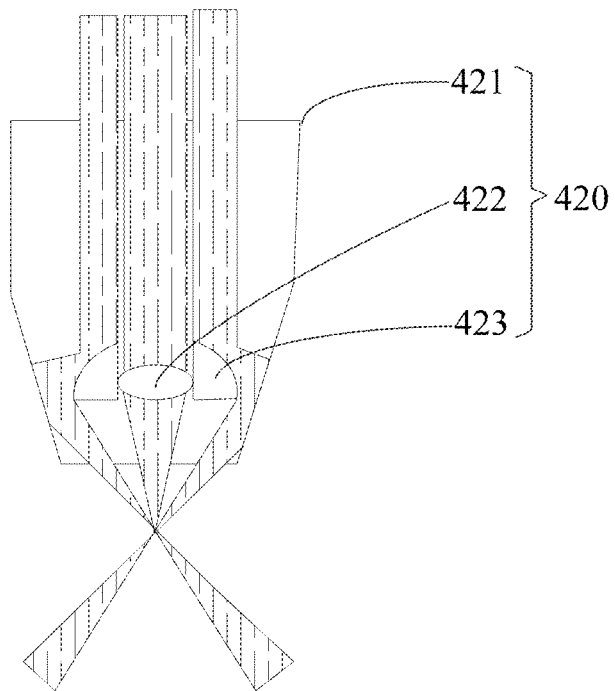
FIG. 4 is a schematic view of an optical path of a dark field focusing unit according to an embodiment of the present disclosure.
Figure 5:
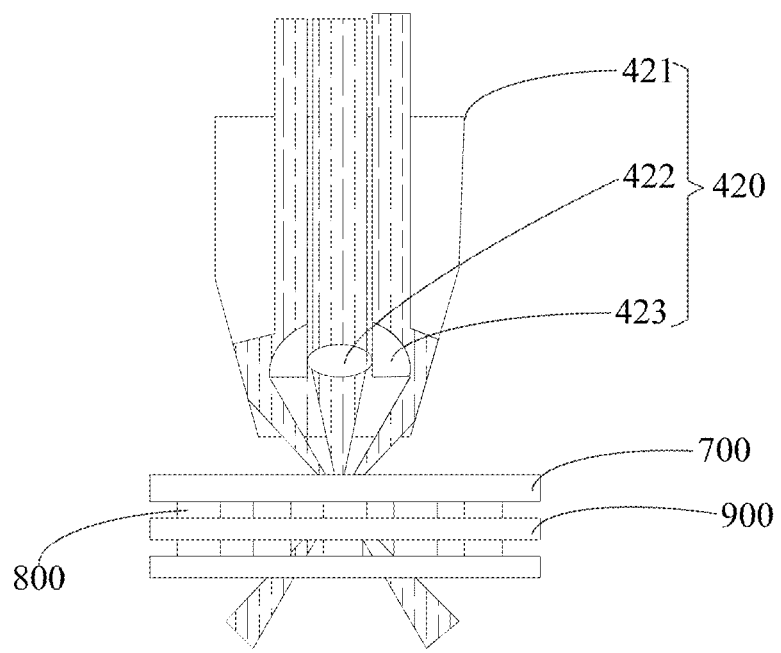
FIG. 5 is a schematic view of a usage state of a dark field focusing unit according to an embodiment of the present disclosure.
Figure 6:
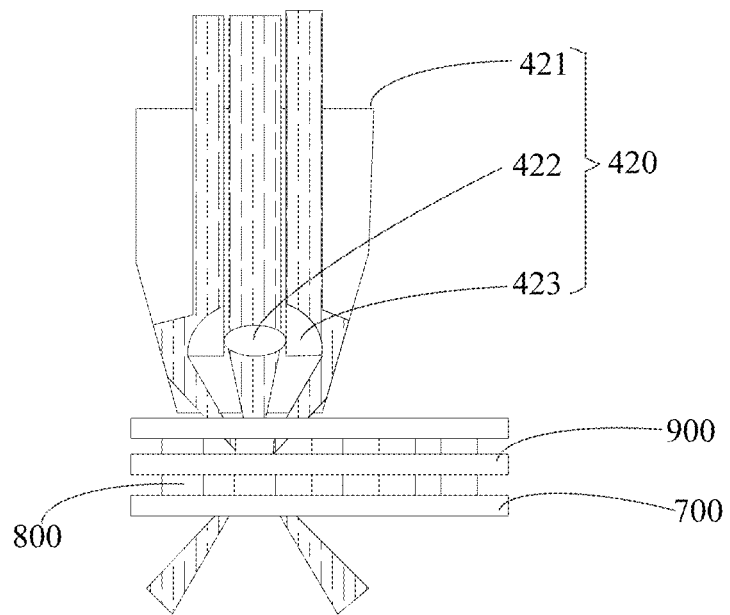
FIG. 6 is a schematic view of a usage state of a dark field focusing unit according to an embodiment of the present disclosure.

Referring to FIG. 1 to FIG. 6, FIG. 1 is a schematic diagram of a laser transfer printing device according to an embodiment of the present disclosure; FIG. 2 is a schematic view of an optical path of a bright field focusing unit according to an embodiment of the present disclosure; FIG. 3 is a schematic view of a usage state of a bright field focusing unit according to an embodiment of the present disclosure; FIG. 4 is a schematic view of an optical path of a dark field focusing unit according to an embodiment of the present disclosure; FIG. 5 is a schematic view of a usage state of a dark field focusing unit according to an embodiment of the present disclosure; FIG. 6 is a schematic view of a usage state of a dark field focusing unit according to an embodiment of the present disclosure.

As shown in FIG. 1 to FIG. 6, a laser transfer printing device includes a laser 100, a beam expander 200, a beam splitter 300 and a focusing module 400. The laser 100 is configured to generate a laser beam. The beam expander 200 is disposed on an optical path of the laser beam generated by the laser 100 to expand the laser beam generated by the laser 100. The beam splitter 300 is disposed on an optical path of the laser beam expanded by the beam expander 200 to reflect the expanded laser beam to a focusing module 400. The focusing module 400 is disposed on an optical path of the laser beam reflected by the beam splitter 300 to focus the laser beam and project the focused laser beam to a predetermined transfer processing position.

Specifically, the laser 100 may be a continuous laser. In the traditional technology, since a laser beam generated by a femtosecond laser belongs to pulse laser, the femtosecond laser needs to be switched multiple times during a transfer printing process, which will affect the service life and industrialization of the laser. Since the continuous laser costs less than a pulse laser and does not need to be switched multiple times, it is possible to prolong the service life of the laser 100 and industrialize the laser transfer printing technology. The laser beam generated by the laser 100 enters the beam expander 200 to be expanded by the beam expander 200. The laser beam may be expanded by increasing the diameter of the laser beam to form a cylindrical laser beam with a circular cross section, or may be expanded by increasing the diameter of the laser beam to form a tubular laser beam with an annular cross section. The energy of the expanded laser beam is more dispersed and the laser energy in a non-condensing area is lower, which can better limit the thermal diffusion and improve the transfer accuracy during the transfer printing process. The expanded laser beam is reflected on a surface of the beam splitter 300, and the reflected laser beam enters the focusing module 400 vertically. The focusing module 400 focuses the laser beam and projects the focused laser beam to a predetermined transfer processing position, in which a transfer printing space has a boundary with a light intensity attenuated to 1/e of that of a center of the space. A device 800 disposed on a shape memory polymer substrate 700 is transferred to a flexible substrate 900 using the transfer printing space.

The laser transfer printing device further includes an imaging module 510 and a display module 520. The focusing module 400 receives the laser beam reflected at the predetermined transfer processing position and transmits the laser beam reflected at the transfer processing position to the imaging module 510, and the imaging module 510 is configured to receive the laser beam reflected at the predetermined transfer processing position to obtain an image of the predetermined transfer processing position. The display module 520 is configured to receive and display the image of the predetermined transfer processing position. The imaging module 510 and the display module 520 are used for in-situ observation. Since the image displayed by the display module 520 is an enlarged image of a focus position, i.e. the image of the predetermined transfer processing position, it is possible to more clearly observe the state of the focus position and to more accurately image without the interference caused by other imaging rays. Further, it is possible to more accurately adjust the position of the transfer printing space and control the transfer printing in adjusting the transfer printing space to perform the transfer printing. In the current laser transfer printing technology, the laser beam is directly used to perform the transfer printing. However, when the flexible substrate 900 is a non-planar substrate, e.g., the flexible substrate 900 has a non-planar surface such as protrusions or grooves, the traditional transfer printing technology cannot meet the transfer printing requirements in transferring onto side walls of the protrusions or grooves and other areas not covered by the laser beam. That is, the traditional transfer printing technology can only perform transfer printing on a flat substrate. In this embodiment, by using the transfer printing space to transfer a related device 800, it is possible to transfer onto side walls of protrusions or grooves of a non-planar substrate. That is, in the present disclosure, it is possible to transfer on a non-planar substrate. When the devices 800 need to be simultaneously transferred onto upper and lower surfaces of the flexible substrate 900, it is possible to achieve the transferring onto the upper and lower surfaces of the flexible substrate 900 by adjusting the size and the position of the transfer printing space. Since the laser beam is focused by the focusing module 400, the laser irradiation area and thus the range of thermal diffusion are reduced. By using the transfer printing space for transfer printing, the impact on other peripheral devices is reduced to achieve high-precision selective transfer printing.

More specifically, the laser transfer printing device further includes a light source pinhole 610. The light source pinhole 610 is disposed on an optical path between the laser 100 and the beam expander 200 to eliminate a scattering of the laser beam itself, which avoids the interference from the scattering to subsequent operations. Since the laser power is not uniform, the low energy part of the beam is filtered out to improve the laser focusing effect. More specifically, the laser transfer printing device further includes an imaging pinhole 620. The imaging pinhole 620 is disposed between the beam splitter 300 and the imaging module 510 to filter an interference laser beam reflected at the predetermined transfer processing position, which enables only the laser beam reflected by the focus position to pass through the imaging pinhole 620 to improve the imaging clarity.

Specifically, the focusing module 400 is a bright field focusing unit 410 including a focusing lens 411 and an optical lens 412, in which the focusing lens 411 has an incident end and an exit end. An expanded cylindrical laser beam enters the focusing lens 411 at the incident end. The optical lens 412 is configured to focus the laser beam and project the focused laser beam to the predetermined transfer processing position. The bright field focusing unit 410 is configured to focus the cylindrical laser beam expanded by the beam expander 200 to form a transfer printing space and to perform transfer printing through the transfer printing space, in which the transfer printing space has a boundary with a light intensity attenuated to 1/e of that of a center of the space. By selecting a single optical lens or an optical lens group with different focusing degrees, it is possible to adjust the size of the transfer printing space. The cylindrical laser beam reflected by the beam splitter 300 vertically enters the focusing lens 411 at the incident end of the bright field focusing unit 410, and then the incident laser beam is focused by the optical lens 412 disposed in the focusing lens 411 to perform transfer printing in the transfer printing space. The optical lens 412 may be a single optical lens or an optical lens group, which is adjusted such that a focus distance of the single optical lens or the optical lens group is in a range of 2 mm to 10 mm. The laser beam reflected at the predetermined transfer processing position is received by the bright field focusing unit 410, and enters the display module 520 via the optical lens 412, the beam splitter 300 and the imaging module 510 for display. The laser intensity in the transfer printing space is much greater than that in a non-transfer printing space, and decays exponentially from a center to all directions of the three-dimensional space. Generally, the boundary of the transfer printing space is defined as a position whose laser intensity is attenuated to 1/e of that of a center of the transfer printing space. The transfer printing space of the bright field focusing unit 410 has an elliptical sphere shape, and the bright field focusing unit 410 has a background light in a propagation direction of the laser beam, so that the bright field focusing unit 410 has gradiently distributed focusing energy, and thereby tiny individual devices are effectively transferred by the bright field focusing unit 410.

Specifically, the focusing module 400 is a dark field focusing unit 420 including a focusing lens 421, an optical mirror 423 and an optical lens 422, in which the focusing lens 421 has an incident end and an exit end. The optical mirror 423 is an annular optical mirror, and the optical lens 422 is disposed in a hole of the annular optical mirror 423. An expanded tubular laser beam enters the focusing lens 421 at the incident end to be reflected for a first time on the optical mirror 423. The first reflected laser beam is reflected for a second time on a side wall of the focusing lens 421. The second reflected laser beam is focused and the focused laser beam is projected to the predetermined transfer processing position. The dark field focusing unit 420 is configured to focus the tubular laser beam expanded by the beam expander 200 to form a transfer printing space and to perform transfer printing through the transfer printing space, in which the transfer printing space is a cubic space formed by convergence of tubular laser beams. By selecting optical mirrors 423 with different curvatures, it is possible to adjust the size of the transfer printing space. The tubular laser beam reflected by the beam splitter 300 vertically enters the focusing lens 421 at the incident end of the dark field focusing unit 420. The tubular laser beam enters the focusing lens 421 to be reflected for a first time on a curved surface of the optical mirror 423 provided annularly. The first reflected laser beam is reflected for a second time on a side wall of the focusing lens 421. The second reflected laser beam exits from the focusing lens 421 through the exit end thereof to be focused, and the focused laser beam is projected to the predetermined transfer processing position. The optical mirror 423 may be a single optical mirror or an optical mirror group. An optical lens 422 is disposed in a hole of the annular optical mirror 423. The laser beam reflected at predetermined transfer processing position is received by the dark field focusing unit 420, and enters the display module 520 via the optical lens 422, the beam splitter 300 and the imaging module 510 for display. The optical lens 422 may be a single optical lens or an optical lens group, which is adjusted such that a focus distance of the single optical lens or the optical lens group is in a range of 2 mm to 10 mm. Generally, the transfer printing space of the dark field focusing unit 420 is a cubic space, and the dark field focusing unit 420 has no background light in a propagation direction of the laser beam, so that the dark field focusing unit 420 has uniform focusing energy and thus it is possible to transfer a batch of devices at the same time to realize batch transfer.

In using the laser transfer printing device to transfer on a non-planar flexible substrate, by adjusting the position and size of the transfer printing space relative to the shape memory polymer substrate automatically or manually, it is possible to adjust the position of a focus area to any protrusions or grooves of the non-planar substrate where devices need to be transferred. Moreover, it is possible to transfer devices by adjusting the position of a focus area to an upper or lower surface transfer position of the non-planar flexible substrate.

Figure 7:
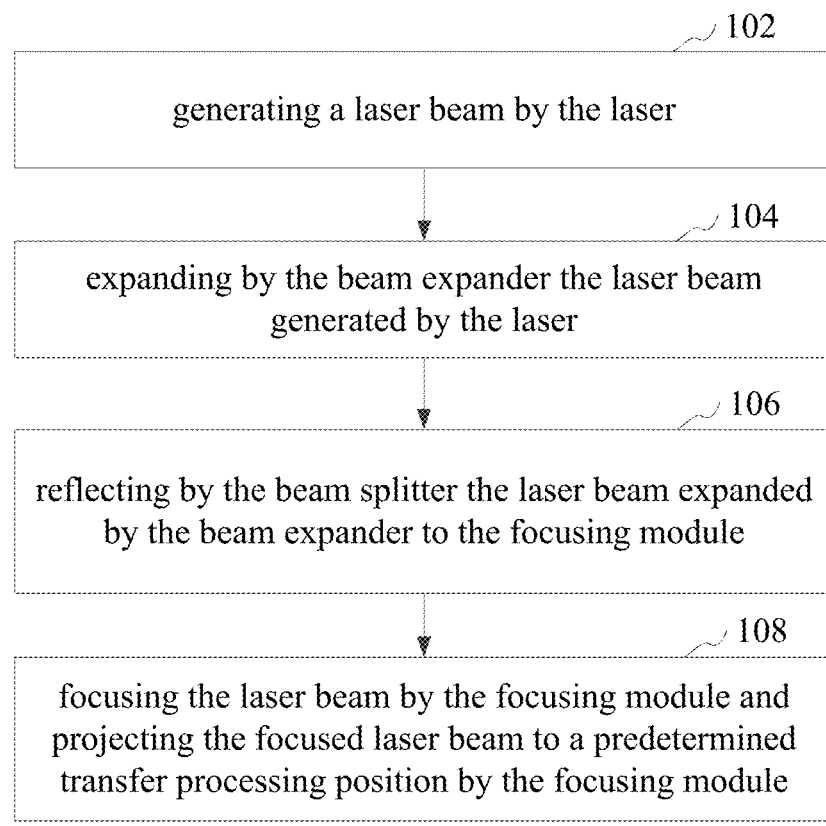
FIG. 7 is a flow chart of a laser transfer printing method according to an embodiment of the present disclosure.

Referring to FIG. 7, FIG. 7 is a flow chart of a laser transfer printing method according to an embodiment of the present disclosure.

A laser transfer printing method for the abovementioned laser transfer printing device is as shown in FIG. 7. The method includes steps as follows:

In step 102: the laser generates a laser beam.

In step 104: the beam expander expands the laser beam generated by the laser.

In step 106: the laser beam expanded by the beam expander is reflected by the beam splitter to the focusing module.

In step 108: the focusing module focuses the laser beam and projects the focused laser beam to a predetermined transfer processing position.

Specifically, the transfer printing space is a space from the focus position to a position whose light intensity is attenuated to 1/e of that of the focus position, and a device disposed on the shape memory polymer substrate is transferred to a flexible substrate based on the transfer printing space. Moreover, the size and the position of the transfer printing space can be adjusted. In the bright field focusing unit, the size of the transfer printing space can be adjusted by selecting a single optical lens 412 or an optical lens group with different focusing degrees. In the dark field focusing unit, the size of the transfer printing space can be adjusted by selecting optical mirrors 423 with different curvatures. Concerning specific details of the laser transfer printing method, reference is made to details of the laser transfer printing device described above, which will not be repeatedly explained here.

The laser beam generated by the laser is expanded and reflected by the abovementioned laser transfer printing device to the focusing module. The focusing module focuses the laser beam and projects the focused laser beam to the predetermined transfer processing position to perform transfer processing. The laser beam is expanded and then focused by a laser confocal process, and thus the laser energy in the transfer printing space is much larger than the energy in a non-focusing area. By using the transfer printing space formed by focusing, it is possible to complete the device transfer on the non-planar substrate without constraints of planes. Moreover, the size of the transfer printing space is very small, the laser energy in the non-transfer printing space is very low, which can better limit the thermal diffusion and improve the transfer accuracy during the transfer printing process. The continuous laser has less cost and longer service life than the pulse laser, which is beneficial to industrialization of the laser transfer printing technology.

The technical features described above in one or more embodiments may be combined in any suitable manner. In an effort to provide a concise description, all possible combinations of individual technical features of these embodiments may not be described in the specification. However, as long as there is no contradiction in the combination of these technical features, it should be considered within the scope of this specification.

Although the description above contains many particulars, these should not be construed as limiting the scope of the present disclosure, but merely providing illustration of some of the presently preferred embodiments of the present disclosure. It should be noted that the improvements and the modifications can be made by those skilled in the art without departing the concept of the present disclosure, which shall be within the protection scope of the present disclosure. Therefore, the protection scope of the present disclosure shall be defined by the claims.

What is claimed is:

1. A laser transfer printing device, comprising:
   a laser configured to generate a laser beam;
   a beam expander disposed on an optical path of the laser beam generated by the laser to expand the laser beam generated by the laser, the laser beam being expanded by increasing a diameter of the laser beam;
   a beam splitter disposed on an optical path of the laser beam expanded by the beam expander to reflect the expanded laser beam to a focusing module; and
   the focusing module disposed on an optical path of the laser beam reflected by the beam splitter to focus the laser beam and project the focused laser beam to a predetermined transfer processing position to form a transfer printing space, the transfer printing space having a boundary with a light intensity attenuated to 1/e of that of a center of the space.

2. The laser transfer printing device according to claim 1, further comprising:
   an imaging module configured to receive the laser beam reflected at the predetermined transfer processing position to obtain an image of the predetermined transfer processing position; and
   a display module configured to receive and display the image of the predetermined transfer processing position.

3. The laser transfer printing device according to claim 2, wherein the image displayed by the display module is an enlarged image of the predetermined transfer processing position.

4. The laser transfer printing device according to claim 1, further comprising:
   a light source pinhole disposed on an optical path between the laser and the beam expander to eliminate a scattering of the laser beam itself.

5. The laser transfer printing device according to claim 1, further comprising an imaging pinhole disposed between the beam splitter and the imaging module to filter an interference laser beam reflected at the predetermined transfer processing position.

6. The laser transfer printing device according to claim 1, wherein the laser is a continuous laser.

7. The laser transfer printing device according to claim 1, wherein:
   the focusing module is a bright field focusing unit comprising a focusing lens and an optical lens;
   the focusing lens has an incident end and an exit end; and
   an expanded cylindrical laser beam enters the focusing lens at the incident end, and the optical lens is configured to focus the laser beam and project the focused laser beam to the predetermined transfer processing position.

8. The laser transfer printing device according to claim 7, wherein the bright field focusing unit is configured to focus the laser beam, and projects the focused laser beam to the predetermined transfer processing position to form the transfer printing space.

9. The laser transfer printing device according to claim 8, wherein the transfer printing space of the bright field focusing unit has an elliptical sphere shape.

10. The laser transfer printing device according to claim 1, wherein the focusing module is a dark field focusing unit comprising a focusing lens, an optical mirror and an optical lens;
   the focusing lens has an incident end and an exit end;
   the optical mirror is an annular optical mirror, and the optical lens is disposed in a hole of the annular optical mirror; and an expanded tubular laser beam enters the focusing lens at the incident end, and is reflected for a first time on the optical mirror, the first reflected laser beam is reflected for a second time on a side wall of the focusing lens, and the second reflected laser beam is focused, the focused laser beam is projected to the predetermined transfer processing position.

11. The laser transfer printing device according to claim 10, wherein:

the dark field focusing unit is configured to focus the laser beam, and project the focused laser beam to the predetermined transfer processing position to form the transfer printing space; and the transfer printing space is a cubic space with uniform light intensity.

12. The laser transfer printing device according to claim 7, wherein a focus distance of the optical lens is in a range of 2 mm to 10 mm.

13. The laser transfer printing device according to claim 7, wherein the optical lens is an optical lens group.

14. The laser transfer printing device according to claim 10, wherein a focus distance of the optical lens is in a range of 2 mm to 10 mm.

15. The laser transfer printing device according to claim 10, wherein the optical lens is an optical lens group.

16. A laser transfer printing method for a laser transfer printing device, comprising:

generating a laser beam by a laser;

expanding by a beam expander the laser beam generated by the laser, the laser beam being expanded by increasing a diameter of the laser beam;

reflecting by a beam splitter the laser beam expanded by the beam expander to a focusing module; and focusing the laser beam by the focusing module and projecting the focused laser beam to a predetermined transfer processing position by the focusing module to form a transfer printing space, wherein the transfer printing space having a boundary with a light intensity attenuated to 1/e of that of a center of the space.

17. The laser transfer printing method according to claim 16, wherein when the focusing module is a bright field focusing unit, and a device disposed on a shape memory polymer substrate is transferred to a flexible substrate based on the transfer printing space.

18. The laser transfer printing method according to claim 16, wherein the laser transfer printing device further comprises:

an imaging module configured to receive the laser beam reflected at the predetermined transfer processing position to obtain an image of the predetermined transfer processing position; and a display module configured to receive and display the image of the predetermined transfer processing position.

19. The laser transfer printing method according to claim 16, wherein the focusing module is a bright field focusing unit comprising a focusing lens and an optical lens;

the focusing lens has an incident end and an exit end; and an expanded cylindrical laser beam enters the focusing lens at the incident end, and the optical lens is configured to focus the laser beam and project the focused laser beam to the predetermined transfer processing position.

20. The laser transfer printing method according to claim 16, wherein the focusing module is a dark field focusing unit comprising a focusing lens, an optical mirror and an optical lens;

the focusing lens has an incident end and an exit end;

the optical mirror is an annular optical mirror, and the optical lens is disposed in a hole of the annular optical mirror; and an expanded tubular laser beam enters the focusing lens at the incident end, and is reflected for a first time on the optical mirror, the first reflected laser beam is reflected for a second time on a side wall of the focusing lens, and the second reflected laser beam is focused, the focused laser beam is projected to the predetermined transfer processing position.

* * * * *